(12) United States Patent
Choi et al.

(10) Patent No.: US 9,377,494 B2
(45) Date of Patent: Jun. 28, 2016

(54) APPARATUS AND METHOD FOR ANALYZING DISTRIBUTION OF ELECTROMAGNETIC WAVE IN RADIO WAVE SYSTEM

(71) Applicant: ELECTRONICS AND TELECOMMUNICATIONS RESEARCH INSTITUTE, Daejeon (KR)

(72) Inventors: Sung Woong Choi, Daejeon (KR); Hyo Joon Eom, Daejeon (KR); Sang Bong Jeon, Daejeon (KR); Seung Keun Park, Daejeon (KR); Jun Cheol Park, Gyeonggi-do (KR)

(73) Assignee: ELECTRONICS AND TELECOMMUNICATIONS RESEARCH INSTITUTE, Daejon (KR)

( * ) Notice: Subject to any disclaimer, the term of this patent is extended or adjusted under 35 U.S.C. 154(b) by 613 days.

(21) Appl. No.: 13/727,016

(22) Filed: Dec. 26, 2012

(65) Prior Publication Data

US 2014/0129168 A1    May 8, 2014

(30) Foreign Application Priority Data

Nov. 7, 2012   (KR) .................. 10-2012-0125494

(51) Int. Cl.
*G01R 29/10* (2006.01)
*G01R 29/08* (2006.01)

(52) U.S. Cl.
CPC ........ *G01R 29/0814* (2013.01); *G01R 29/0821* (2013.01)

(58) Field of Classification Search
CPC ........... G01R 29/0814; G01R 29/0821; G01R 29/10; H05K 9/0069
USPC .......... 702/38, 57, 62, 66, 67, 71, 73; 324/96, 324/627, 639; 343/703
See application file for complete search history.

(56) References Cited

U.S. PATENT DOCUMENTS

| | | | |
|---|---|---|---|
| 5,793,215 A * | 8/1998 | Yun | 324/627 |
| 7,642,973 B2 * | 1/2010 | Maekawa et al. | 343/703 |
| 2013/0006553 A1 * | 1/2013 | Kwon et al. | 702/57 |

OTHER PUBLICATIONS

Jaehoon Yun, et al; "Numerical Solution of Higher Order Mode Cutoff Frequencies in Asymmetric TEM Cells by Galerkin Method", IEEE Transactions on Electromagnetic Compatibility, vol. 41, No. 4, Nov. 1999, pp. 273-279.

(Continued)

*Primary Examiner* — John H Le
(74) *Attorney, Agent, or Firm* — Ladas & Parry LLP (57) ABSTRACT

Disclosed are an apparatus and a method for analyzing a distribution of electromagnetic waves using a 4-port transverse electromagnetic (TEM) cell in a radio wave system. The apparatus for analyzing a distribution of electromagnetic waves in a radio wave system includes: an input unit configured to apply a reference electrostatic potential to an inside of a 4-port transverse electromagnetic (TEM) cell in which electronic devices are located; a calculation unit configured to calculate electrostatic potentials inside the 4-port TEM cell using a mode matching scheme; an analysis unit configured to analyze the distribution of electromagnetic waves inside the 4-port TEM cell through the electrostatic potentials inside the 4-port TEM cell; and an output unit configured to output the distribution of electromagnetic waves inside the 4-port TEM cell.

12 Claims, 6 Drawing Sheets

(56) References Cited

OTHER PUBLICATIONS

Woon-Joo Jeon, et al; "Mode-Matching Analysis for Complex Antenna Factors of Circular Top-Hat EMI Monopole Antennas", Journal of Korean Institute of Electromagnetic Engineering and Science, vol. 14, No. 10, pp. 1024-1029; Oct. 2003.

* cited by examiner

APPARATUS AND METHOD FOR ANALYZING DISTRIBUTION OF ELECTROMAGNETIC WAVE IN RADIO WAVE SYSTEM

CROSS-REFERENCE TO RELATED APPLICATIONS

The present application claims priority of Korean Patent Application No. 10-2012-0125494, filed on Nov. 7, 2012, which is incorporated herein by reference in its entirety.

BACKGROUND OF THE INVENTION

1. Field of the Invention

Exemplary embodiments of the present invention relate to a radio wave system, and more particularly, to an apparatus and a method for analyzing a distribution of electromagnetic waves using a 4-port transverse electromagnetic (TEM) cell.

2. Description of Related Art

Recently, due to the increased demand for various types of communication and broadcasting services including personal communication services, various electronic devices which can provide the services to users have been proposed. Further, the electronic devices transmit a radio wave signal in a predetermined frequency band to users to provide various types of communication services and broadcasting services to users.

As the electronic devices transmit the radio wave signal in a predetermined frequency band, the electronic devices generate various electromagnetic waves, wherein the electromagnetic waves serve as electromagnetic wave noise for other electronic devices to lead to a malfunction of other electronic devices and the electromagnetic waves for the electronic devices may damage a body of a user. Therefore, there is a need to accurately analyze a distribution of electromagnetic waves of the electronic devices.

However, methods for analyzing the distribution of electromagnetic waves using the 4-port TEM cell, and the like, in the current radio wave system have been schematically proposed, but a method for accurately measuring a distribution of electromagnetic waves of electronic devices has not yet been proposed. In particular, a detailed method for analyzing a distribution of electromagnetic waves using the 4-port TEM cell has not yet been proposed.

Therefore, a need exists for a method for accurately analyzing the distribution of electromagnetic waves for currently used electronic devices so as to minimize the damage of a body of a user and the malfunction of electronic devices due to the electromagnetic waves of electronic devices in the radio wave system.

SUMMARY OF THE INVENTION

An embodiment of the present invention is directed to an apparatus and a method for analyzing a distribution of electromagnetic waves in a radio wave system.

Another embodiment of the present invention is direct to an apparatus and a method for accurately analyzing a distribution of electromagnetic waves of a radio wave system using a 4-port transverse electromagnetic (TEM) cell.

The foregoing and other objects, features, aspects and advantages of the present invention will be understood and become more apparent from the following detailed description of the present invention. Also, it can be easily understood that the objects and advantages of the present invention can be realized by the units and combinations thereof recited in the claims.

An apparatus for analyzing a distribution of electromagnetic waves in a radio wave system, includes: an input unit configured to apply a reference electrostatic potential to an inside of a 4-port transverse electromagnetic (TEM) cell in which electronic devices are located; a calculation unit configured to calculate electrostatic potentials inside the 4-port TEM cell using a mode matching scheme; an analysis unit configured to analyze the distribution of electromagnetic waves inside the 4-port TEM cell through the electrostatic potentials inside the 4-port TEM cell; and an output unit configured to output the distribution of electromagnetic waves inside the 4-port TEM cell.

A method for analyzing a distribution of electromagnetic waves in a radio wave system, includes: applying a reference electrostatic potential to an inside of a 4-port transverse electromagnetic (TEM) cell in which electronic devices are located; calculating electrostatic potentials inside the 4-port TEM cell using a mode matching scheme; and analyzing the distribution of electromagnetic waves inside the 4-port TEM cell based on the electrostatic potentials inside the 4-port TEM cell.

DESCRIPTION OF SPECIFIC EMBODIMENTS

Hereinafter, embodiments of the present invention will be described in detail with reference to the accompanying drawings. It is to be noted that only components required to understand an operation in accordance with the present invention is described below and the description of other components will be omitted not to unnecessarily obscure the subject matters of the present invention.

An embodiment of the present invention proposes an apparatus and a method for analyzing a distribution of transverse electromagnetic (TEM) plane waves that are electromagnetic waves in a radio wave system. Herein, although the embodiment of the present invention describes an example of analyzing a distribution of electromagnetic waves using a 4-port TEM cell in a radio wave system, a method for analyzing a distribution of electromagnetic waves proposed in the embodiment of the present invention may be applied even to the case of analyzing the electromagnetic waves using cells other than the 4-port TEM cell.

Further, in the embodiment of the present invention, the distribution of electromagnetic waves according to application of electrostatic potential in the radio wave system is accurately analyzed using a mode matching method, such that a damage of a body of a user and a malfunction of electronic devices can be minimized due to the electromagnetic waves of electronic devices. Herein, the 4-port TEM cell used to analyze the distribution of electromagnetic waves of the electronic devices in the radio wave system in accordance with the embodiment of the present invention will be described below in more detail.

Figure 1:
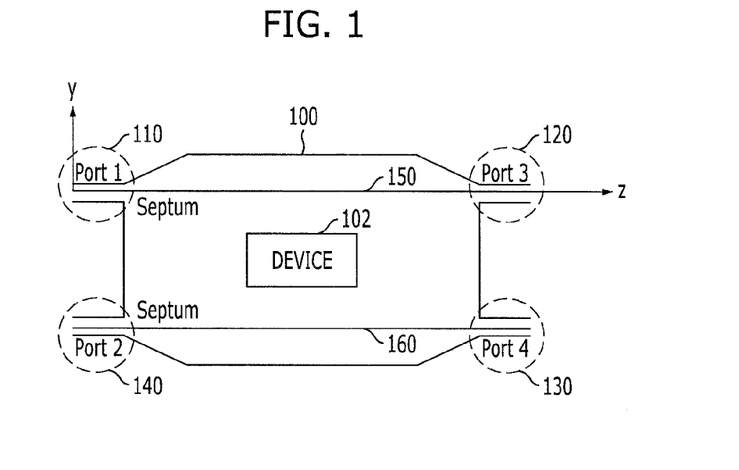
FIG. 1 is a diagram schematically illustrating a structure of a 4-port TEM cell analyzing a distribution of electromagnetic waves in a radio wave system in accordance with an embodiment of the present invention.

FIG. 1 is a diagram schematically illustrating a structure of a 4-port TEM cell analyzing a distribution of electromagnetic waves of electronic devices in a radio wave system in accordance with an embodiment of the present invention.

Referring to FIG. 1, electronic devices for analyzing a distribution of electromagnetic waves in a radio wave system, for example, a device 102 is located inside a 4-port TEM cell 100, the 4-port TEM cell 110 includes a multi-port, for example, 4-ports, that is, port 1 110, port 2 140, port 3 120, and port 4 130 and includes a conductor of zero-potential formed in the outside thereof and two conductor septa 150 and 160 formed therein.

Here, the inside of the 4-port TEM cell 100 has a structure in which the conductors of the septa 150 and 160 are not bent, feeding terminals are spaced apart from each other to facilitate impedance matching, and a frequency window having a high Q factor is generated to widen a use frequency band. Further, in the inside of the 4-port TEM cell 100, the TEM plane wave is generated between the two septa 150 and 160. Herein, the inside of the 4-port TEM cell used to analyze the distribution of electromagnetic waves of the electronic devices in the radio wave system in accordance with the embodiment of the present invention will be described below in more detail with reference to FIGS. 2 to 6.

FIGS. 2 to 6 are diagrams schematically illustrating the structure of the 4-port TEM cell analyzing the distribution of electromagnetic waves of electronic devices in the radio wave system in accordance with an embodiment of the present invention.

Figure 2:
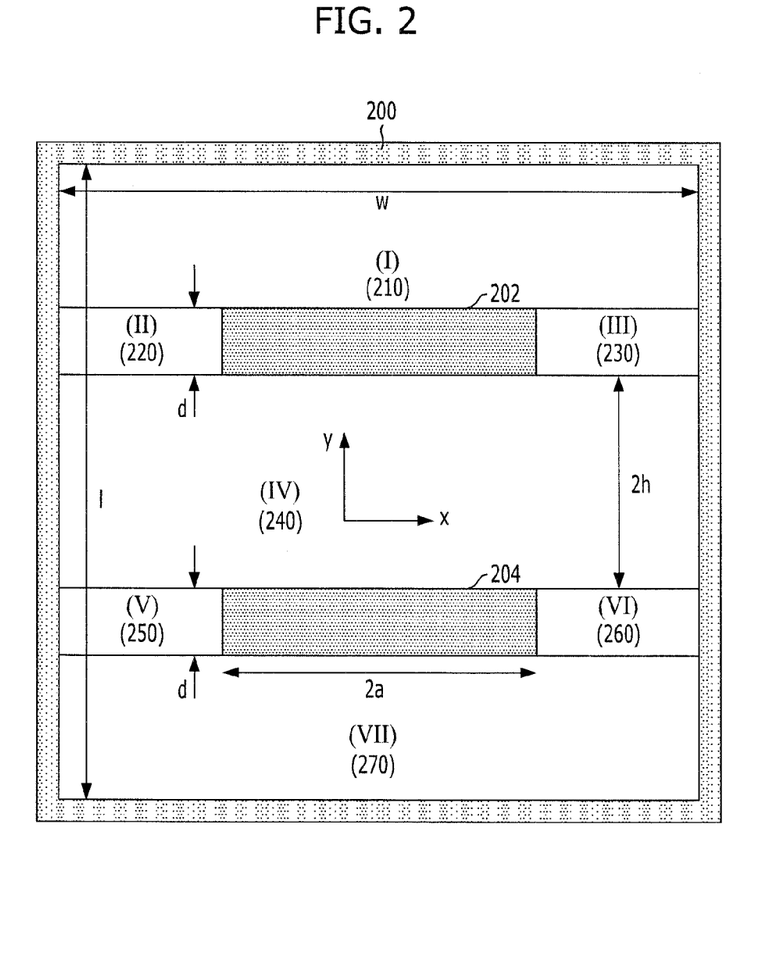
FIGS. 2 to 6 are diagrams schematically illustrating an internal cross section structure of the 4-port TEM cell analyzing the distribution of electromagnetic waves in the radio wave system in accordance with the embodiment of the present invention.

Referring first to FIG. 2, as described above, the 4-port TEM cell includes the 4-ports and includes the conductor of zero-potential formed in the outside thereof and two septa 202 and 204 formed therein, such that an inside 200 of the 4-port TEM cell is divided into seven regions, for example, a first region 210, a second region 220, a third region 230, a fourth region 240, a fifth region 250, a sixth region 260, and a seventh region 270. Here, l represents a y-axis direction, w represents a size in the inside 200 of the 4-port TEM cell, d represents a thickness of the septa 202 and 204, 2a represents a size of the septa 202 and 204, and 2h represents a spaced distance between the septa 202 and 204.

Here, when each of the septa 202 and 204 included in the inside 200 of the 4-port TEM cell has electrostatic potential, for example, a potential of V1 and V2, the potential distribution of the inside 200 of the 4-port TEM cell is calculated by Laplace Equation and a distribution of electric field in a cross section of the 4-port TEM cell has TEM mode characteristics that are present in the inside 200 of the 4-port TEM cell. In this case, the seven regions 210, 220, 230, 240, 250, 260, and 270 of the inside 200 of the 4-port TEM cell become a closed region and the potential distribution of the seven regions 210, 220, 230, 240, 250, 260, and 270 is represented by a Fourier sine series that is a sum of discontinuous modes.

Figure 3:
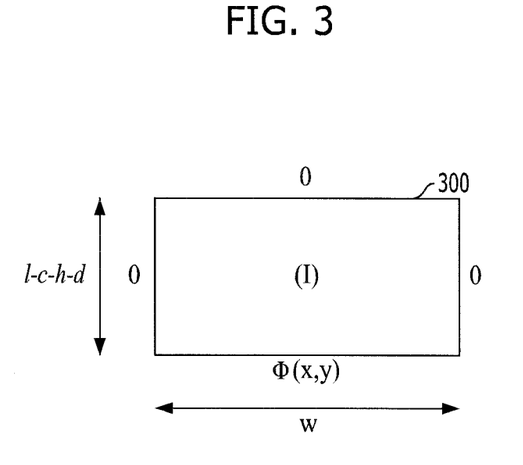

Describing in more detail, as illustrated in FIG. 3, a first region 300 of the inside of the 4-port TEM cell has a range of −b<x<w−b, h+d<y<l−c and l=2c and w=2b. In the range −b<x<w−b, h+d<y<l−c of the first region 300, electrostatic potential $\Phi^I(x, y)$ satisfies Laplace Equation on an x-y plane represented by the following Equation 1, such that the electrostatic potential $\Phi^I(x, y)$ of the first region 300 may be represented by the following Equation 2 based on separation of variables.

$$\left(\frac{\partial^2}{\partial x^2} + \frac{\partial^2}{\partial y^2}\right)\Phi^I(x, y) = 0 \qquad \text{[Equation 1]}$$

$$\Phi^I(x, y) = \sum_{m=1}^{+\infty} A_m \sinh(\alpha_m(y - l + c))\sin(\alpha_m(x + b)) \qquad \text{[Equation 2]}$$

$$\alpha_m = \frac{m\pi}{w}$$

and $$m = 1, 2, 3\ldots$$

Figure 4:
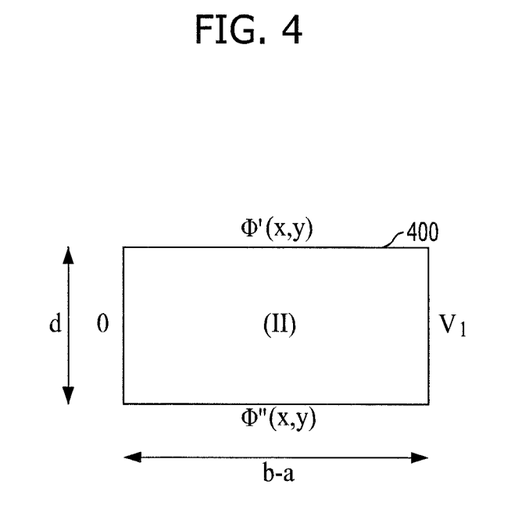
Figure 5:
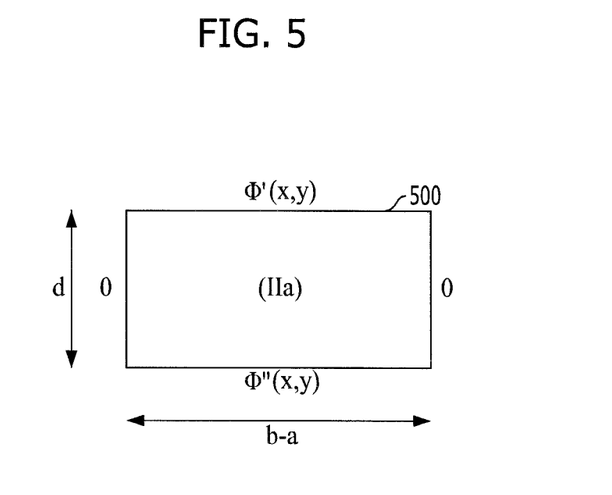
Figure 6:
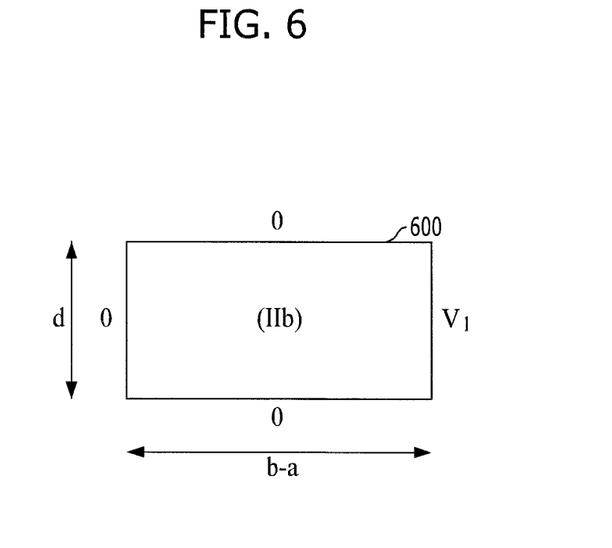

In addition, as illustrated in FIG. 4, a second area 400 inside the 4-port TEM cell is in a region of −b<x<−a, h<y<h+d. In the range −b<x<−a, h<y<h+d of the second region, as illustrated in FIGS. 5 and 6, the second region 400 inside the 4-port TEM cell may be decomposed into a second region a 500 and a second region b 600. In this case, the electrostatic potential $\Phi^{II}(x, y)$ is calculated by calculating electrostatic potentials in the second region a 500 and the second region b 600, respectively, and then, adding the calculated electrostatic potentials in the second region a 500 and the second region b 600. Here, the electrostatic potential $\Phi^{II}(x, y)$ of the second region may be represented by the following Equation 3.

$$\Phi^{II}(x, y) = \sum_{m=1}^{+\infty}(B_m\cosh(\beta_m y) + C_m\sinh(\beta_m y))\sin(\beta_m(x + b)) + \frac{4V_1}{\pi}\sum_{k=0}^{+\infty}\frac{\sinh(\gamma_{2k+1}(x+b))}{(2k+1)\sinh(\gamma_{2k+1}(b-a))}\sin(\gamma_{2k+1}(y-h)), \qquad \text{[Equation 3]}$$

where $$\beta_m = \frac{m\pi}{b-a},$$

$$\gamma_{2k+1} = \frac{(2k+1)\pi}{d},$$

and $$k = 0, 1, 2, \ldots$$

By the above scheme, as illustrated in FIG. 2, a third region 230 inside the 4-port TEM cell is in the range of a<x<w−b, h<y<h+d. In the range a<x<w−b, h<y<h+d of the third region 230, the electrostatic potential $\Phi^{III}(x, y)$ of the third region 230 may be represented by the following Equation 4.

$$\Phi^{III}(x, y) = \qquad \text{[Equation 4]}$$

$$\sum_{m=1}^{+\infty}(D_m\cosh(\chi_m y) + E_m\sinh(\chi_m y))\sin(\chi_m(x - w + b)) -$$

$$\frac{4V_1}{\pi}\sum_{k=0}^{+\infty}\frac{\sinh(\gamma_{2k+1}(x-w+b))}{(2k+1)\sinh(\gamma_{2k+1}(w-b-a))}\sin(\gamma_{2k+1}(y-h))$$

$$\chi_m = \frac{m\pi}{w-b-a}$$

In addition, as illustrated in FIG. 2, a fourth region 240 inside the 4-port TEM cell is in the range of $-b<x<w-b$, $-h<y<h$. In the range $-b<x<w-b$, $-h<y<h$ of the fourth region 240, the electrostatic potential $\Phi^{IV}(x, y)$ of the fourth region 240 may be represented by the following Equation 5.

$$\Phi^{IV}(x,y) = \sum_{m=1}^{+\infty}(F_m\cosh(\alpha_m y) + G_m\sinh(\alpha_m y))\sin(\alpha_m(x+b)) \quad \text{[Equation 5]}$$

In addition, as illustrated in FIG. 2, a fifth region 250 inside the 4-port TEM cell is in the range of $-b<x<-a$, $-h-d<y<-h$. In the range $-b<x<-a$, $-h-d<y<-h$ of the fifth region 250, the electrostatic potential $\Phi^V(x, y)$ of the fifth region 250 may be represented by the following Equation 6.

$$\Phi^V(x,y) = \sum_{m=1}^{+\infty}(H_m\cosh(\beta_m y) + I_m\sinh(\beta_m y))\sin(\beta_m(x+b)) - \quad \text{[Equation 6]}$$
$$\frac{4V_2}{\pi}\sum_{k=0}^{+\infty}\frac{\sinh(\gamma_{2k+1}(x+b))}{(2k+1)\sinh(\gamma_{2k+1}(b-a))}\sin(\gamma_{2k+1}(y+h))$$

In addition, as illustrated in FIG. 2, a sixth region 260 inside the 4-port TEM cell is in the range of $a<x<w-b$, $-h-d<y<-h$. In the range $a<x<w-b$, $-h-d<y<-h$ of the sixth region 260, the electrostatic potential $\Phi^{VI}(x, y)$ of the sixth region 260 may be represented by the following Equation 7.

$$\Phi^{VI}(x,y) = \quad \text{[Equation 7]}$$
$$\sum_{m=1}^{+\infty}(J_m\cosh(\chi_m y) + K_m\sinh(\chi_m y))\sin(\chi_m(x-w+b)) +$$
$$\frac{4V_2}{\pi}\sum_{k=0}^{+\infty}\frac{\sinh(\gamma_{2k+1}(x-w+b))}{(2k+1)\sinh(\gamma_{2k+1}(w-b-a))}\sin(\gamma_{2k+1}(y+h))$$

In addition, as illustrated in FIG. 2, a seventh region 270 inside the 4-port TEM cell is in the range of $-b<x<w-b$, $-c<y<-h-d$. In the range $-b<x<w-b$, $-c<y<-h-d$ of the seventh region 270, the electrostatic potential $V^{II}(x, y)$ of the seventh region 270 may be represented by the following Equation 8.

$$\Phi^{VII}(x,y) = \sum_{m=1}^{+\infty}L_m\sinh(\alpha_m(y+c))\sin(\alpha_m(x+b)) \quad \text{[Equation 8]}$$

As such, the inside of the 4-port TEM cell is divided into seven regions and then, the electrostatic potentials of each region may be represented by expanding a Fourier sine series as represented by the foregoing Equations and any coefficients present in the foregoing Equations, for example, Am, Bm, Cm, Dm, Em, Fm, Hm, Im, Jm, Km, and Lm as discrete mode coefficients are determined in consideration of a boundary condition at points at which each region contacts each other. Here, points at which seven regions inside the 4-port TEM cell each contact each other, that is, four junction points, for example, a first junction point $y=h+d$, a second junction point $y=h$, a third junction point $y=-h$, and a fourth point $y=-h-d$ needs to meet a first boundary condition, for example, a Dirichlet boundary condition and a second condition, for example, a Neumann boundary condition.

Describing in more detail, in the four junction points $y=h+d$, $y=h$, $y=-h$, and $y=-h-d$, a continuity of the electrostatic potentials is satisfied according to the Dirichlet boundary condition, such that in the first junction point $y=h+d$, the electrostatic potential $\Phi^I(x, y)$ of the first region 210 may be represented by the following Equation 9, in the second junction point $y=h$, the electrostatic potential $\Phi^{IV}(x, y)$ of the fourth region 240 may be represented by the following Equation 10, in the third junction point $y=-h$, the electrostatic potential $\Phi^{IV}(x, y)$ may be represented by the following Equation 11, and in the fourth junction point $y=-h-d$, the electrostatic potential $\Phi^{VII}(x, y)$ of the seventh region 270 may be represented by the following Equation 12.

$$\Phi^I(x,y) = \begin{cases} \Phi^{II}(x,y), & -b<x<-a \\ V_1, & -a<x<a \\ \Phi^{III}(x,y), & a<x<w-b \end{cases} \quad \text{[Equation 9]}$$

$$\Phi^{IV}(x,y) = \begin{cases} \Phi^{II}(x,y), & -b<x<-a \\ V_1, & -a<x<a \\ \Phi^{III}(x,y), & a<x<w-b \end{cases} \quad \text{[Equation 10]}$$

$$\Phi^{IV}(x,y) = \begin{cases} \Phi^V(x,y), & -b<x<-a \\ V_2, & -a<x<a \\ \Phi^{VI}(x,y), & a<x<w-b \end{cases} \quad \text{[Equation 11]}$$

$$\Phi^{VII}(x,y) = \begin{cases} \Phi^V(x,y), & -b<x<-a \\ V_2, & -a<x<a \\ \Phi^{VI}(x,y), & a<x<w-b \end{cases} \quad \text{[Equation 12]}$$

Further, at the four junction points $y=h+d$, $y=h$, $y=-h$, and $y=-h-d$ other than septum surface, a continuity of variations in a y-axis direction of the electrostatic potential is satisfied according to the Neumann boundary condition, such that in the first junction point $y=h+d$ other than the septum surface, y-axis variations of an electrostatic potential $\Phi^I(x, y)$ of the first region 210, y-axis variations of an electrostatic potential $\Phi^{II}(x, y)$ of the second region 220, and y-axis variations of an electrostatic potential $\Phi^{III}(x, y)$ of the third region 230 at the first junction point $y=h+d$ other than the septum surface may be represented by the following Equation 13. In addition, y-axis variations of the electrostatic potential $\Phi^{IV}(x, y)$ of the fourth region 240, the y-axis variations of the electrostatic potential $\Phi^{II}(x, y)$ of the second region 220, and the y-axis variations of the electrostatic potential $\Phi^{III}(x, y)$ of the third region 230 at the second junction point $y=h$ other than the septum surface may be represented by the following Equation 14. In addition, the y-axis variations of the electrostatic potential $\Phi^{IV}(x, y)$ of the fourth region 240, y-axis variations of the electrostatic potential $\Phi^V(x, y)$ of the fifth region 250, and y-axis variations of the electrostatic potential $\Phi^{VI}(x, y)$ of the sixth region 260 at the third junction point $y=-h$ other than the septum surface may be represented by the following Equation 15. In addition, y-axis variations of the electrostatic potential $\Phi^{VII}(x, y)$ of the seventh region 270, the y-axis variations of the electrostatic potential $\Phi^V(x, y)$ of the fifth region 250, and the y-axis variations of the electrostatic potential $\Phi^{VI}(x, y)$ of the sixth region 260 at the fourth junction point $y=-h-d$ other than the septum surface may be represented by the following Equation 16.

$$\frac{\partial \Phi^I}{\partial y} = \frac{\partial \Phi^{II}}{\partial y}, -b < x < -a \quad \text{[Equation 13]}$$

$$\frac{\partial \Phi^I}{\partial y} = \frac{\partial \Phi^{III}}{\partial y}, a < x < w-b$$

$$\frac{\partial \Phi^{IV}}{\partial y} = \frac{\partial \Phi^{II}}{\partial y}, -b < x < -a \quad \text{[Equation 14]}$$

$$\frac{\partial \Phi^{IV}}{\partial y} = \frac{\partial \Phi^{III}}{\partial y}, a < x < w-b$$

$$\frac{\partial \Phi^{IV}}{\partial y} = \frac{\partial \Phi^{V}}{\partial y}, -b < x < -a \quad \text{[Equation 15]}$$

$$\frac{\partial \Phi^{IV}}{\partial y} = \frac{\partial \Phi^{VI}}{\partial y}, a < x < w-b$$

$$\frac{\partial \Phi^{VII}}{\partial y} = \frac{\partial \Phi^{V}}{\partial y}, -b < x < -a \quad \text{[Equation 16]}$$

$$\frac{\partial \Phi^{VII}}{\partial y} = \frac{\partial \Phi^{VI}}{\partial y}, a < x < w-b$$

As such, the electrostatic potentials of each region inside the 4-port TEM cell described above are reflected to the foregoing boundary conditions inside the 4-port TEM cell, that is, the Dirichlet boundary condition and the Neumann boundary condition. For example, each region represented in Equations 2 to 4, that is, the electrostatic potential $\Phi^I(x, y)$ of the first region 210, the electrostatic potential $\Phi^{II}(x, y)$ of the second region 220, and the electrostatic potential $\Phi^{III}(x, y)$ of the third region 230 are reflected to Equation 9 of the Dirichlet boundary condition.

As such, in Equations of reflecting each region inside the 4-port TEM cell to the boundary conditions, orthogonality of a triangular function is used. For example, Equations 9 to 12 are multiplied by $\sin(\alpha_n(x+b))$ and then, are integrated with respect to x from $-b$ to $w-b$. Further, the first Equation of Equation 13, the first Equation of Equation 14, the first Equation of Equation 15, and the first Equation of Equation 16 are multiplied by $\sin(\beta_n(x+b))$ and then, are integrated with respect to x from $-b$ to $-a$. Further, the second Equation of Equation 13, the second Equation of Equation 14, the second Equation of Equation 15, and the second Equation of Equation 16 are multiplied by $\sin(\chi_n(x-w+b))$ and then, are integrated with respect to x from a to $w-b$.

In other words, as described above, when integration is performed using the orthogonality of the triangular function and Equations 9 to 16 may be represented like Equations 17 to 28.

$$\frac{w}{2}\sum_{m=1}^{+\infty} A_m \sinh(\alpha_m(h+d-l+c))\delta_{mn} = \quad \text{[Equation 17]}$$

$$\sum_{m=1}^{+\infty}(B_m\cosh(\beta_m(h+d)) + C_m\sinh(\beta_m(h+d)))M_1^{mn} +$$

$$\frac{2V_1}{\alpha_n}\sin(a\alpha_n)\sin(b\alpha_n) +$$

$$\sum_{m=1}^{+\infty}(D_m\cosh(\chi_m(h+d)) + E_m\sinh(\chi_m(h+d)))M_2^{mn}$$

$$\frac{w}{2}\sum_{m=1}^{+\infty}(F_m\cosh(\alpha_m h) + G_m\sinh(\alpha_m h))\delta_{mn} = \quad \text{[Equation 18]}$$

$$\sum_{m=1}^{+\infty}(B_m\cosh(\beta_m h) + C_m\sinh(\beta_m h))M_1^{mn} +$$

$$\frac{2V_1}{\alpha_n}\sin(a\alpha_n)\sin(b\alpha_n) +$$

$$\sum_{m=1}^{+\infty}(D_m\cosh(\chi_m h) + E_m\sinh(\chi_m h))M_2^{mn}$$

$$\frac{w}{2}\sum_{m=1}^{+\infty}(F_m\cosh(\alpha_m h) - G_m\sinh(\alpha_m h))\delta_{mn} = \quad \text{[Equation 19]}$$

$$\sum_{m=1}^{+\infty}(H_m\cosh(\beta_m h) - I_m\sinh(\beta_m h))M_1^{mn} +$$

$$\frac{2V_2}{\alpha_n}\sin(a\alpha_n)\sin(b\alpha_n) +$$

$$\sum_{m=1}^{+\infty}(J_m\cosh(\chi_m h) - K_m\sinh(\chi_m h))M_2^{mn}$$

$$\frac{w}{2}\sum_{m=1}^{+\infty}L_m\sinh(\alpha_m(-h-d+c))\delta_{mn} = \quad \text{[Equation 20]}$$

$$\sum_{m=1}^{+\infty}(H_m\cosh(\beta_m(h+d)) - I_m\sinh(\beta_m(h+d)))M_1^{mn} +$$

$$\frac{2V_2}{\alpha_n}\sin(a\alpha_n)\sin(b\alpha_n) +$$

$$\sum_{m=1}^{+\infty}(J_m\cosh(\chi_m(h+d)) - K_m\sinh(\chi_m(h+d)))M_2^{mn}$$

$$\sum_{m=1}^{+\infty}A_m\alpha_m\cosh(\alpha_m(h+d-l+c))M_1^{mn} = \frac{b-a}{2} \quad \text{[Equation 21]}$$

$$\sum_{m=1}^{+\infty}\beta_m(B_m\sinh(\beta_m(h+d)) + C_m\cosh(\beta_m(h+d)))\delta_{mn} +$$

$$\frac{4V_1}{d}\sum_{k=0}^{+\infty}\frac{\beta_n(-1)^n}{\gamma_{2k+1}^2 + \beta_n^2}$$

$$\sum_{m=1}^{+\infty}A_m\alpha_m\cosh(\alpha_m(h+d-l+c))M_2^{nm} = \frac{w-b-a}{2} \quad \text{[Equation 22]}$$

$$\sum_{m=1}^{+\infty}\chi_m(D_m\sinh(\chi_m(h+d)) + E_m\cosh(\chi_m(h+d)))\delta_{mn} -$$

$$\frac{4V_1}{d}\sum_{k=0}^{+\infty}\frac{\chi_n(-1)^n}{\gamma_{2k+1}^2 + \chi_n^2}$$

$$\sum_{m=1}^{+\infty}\alpha_m(F_m\sinh(\alpha_m h) + G_m\cosh(\alpha_m h))M_1^{nm} = \quad \text{[Equation 23]}$$

$$\frac{b-a}{2}\sum_{m=1}^{+\infty}\beta_m(B_m\sinh(\beta_m h) + C_m\cosh(\beta_m h))\delta_{mn} -$$

$$\frac{4V_1}{d}\sum_{k=0}^{+\infty}\frac{\beta_n(-1)^n}{\gamma_{2k+1}^2 + \beta_n^2}$$

-continued $$\sum_{m=1}^{+\infty}\alpha_m(F_m\sinh(\alpha_m h)+G_m\cosh(\alpha_m h))M_2^{nm}=$$ [Equation 24]

$$\frac{w-b-a}{2}\sum_{m=1}^{+\infty}\chi_m(D_m\sinh(\chi_m h)+E_m\cosh(\chi_m h))\delta_{mn}+$$

$$\frac{4V_1}{d}\sum_{k=0}^{+\infty}\frac{\chi_n(-1)^n}{\gamma_{2k+1}^2+\chi_n^2}$$

$$\sum_{m=1}^{+\infty}\alpha_m(-F_m\sinh(\alpha_m h)+G_m\cosh(\alpha_m h))M_1^{nm}=$$ [Equation 25]

$$\frac{b-a}{2}\sum_{m=1}^{+\infty}\beta_m(-H_m\sinh(\beta_m h)+I_m\cosh(\beta_m h))\delta_{mn}+$$

$$\frac{4V_2}{d}\sum_{k=0}^{+\infty}\frac{\beta_n(-1)^n}{\gamma_{2k+1}^2+\beta_n^2}$$

$$\sum_{m=1}^{+\infty}\alpha_m(-F_m\sinh(\alpha_m h)+G_m\cosh(\alpha_m h))M_2^{nm}=$$ [Equation 26]

$$\frac{w-b-a}{2}\sum_{m=1}^{+\infty}\chi_m(-J_m\sinh(\chi_m h)+K_m\cosh(\chi_m h))\delta_{mn}-$$

$$\frac{4V_2}{d}\sum_{k=0}^{+\infty}\frac{\chi_n(-1)^n}{\gamma_{2k+1}^2+\chi_n^2}$$

$$\sum_{m=1}^{+\infty}\alpha_m L_m\cosh(\alpha_m(-h-d+c))M_1^{nm}=$$ [Equation 27]

$$\frac{b-a}{2}\sum_{m=1}^{+\infty}\beta_m(-H_m\sinh(\beta_m(h+d))+I_m\cosh(\beta_m(h+d)))$$

$$\delta_{mn}-\frac{4V_2}{d}\sum_{k=0}^{+\infty}\frac{\beta_n(-1)^n}{\gamma_{2k+1}^2+\beta_n^2}$$

$$\sum_{m=1}^{+\infty}\alpha_m L_m\cosh(\alpha_m(-h-d+c))M_2^{nm}=\frac{w-b-a}{2}$$ [Equation 28]

$$\sum_{m=1}^{+\infty}\chi_m(-J_m\sinh(\chi_m(h+d))+K_m\cosh(\chi_m(h+d)))$$

$$\delta_{mn}+\frac{4V_2}{d}\sum_{k=0}^{+\infty}\frac{\chi_n(-1)^n}{\gamma_{2k+1}^2+\chi_n^2}$$

That is, any coefficients at the electrostatic potentials of each region inside the 4-port TEM cell represented by the foregoing Equations 2 to 8, that is, Am, Bm, Cm, Dm, Em, Fm, Gm, Hm, Im, Jm, Km, and Lm are calculated by Equations 17 to 28 and in Equations 17 to 28, δmn, which is Kronecker delta, becomes 1 if m is equal to n (m=n) and becomes 0 if m is different from n (m≠n). Further, in Equations 17 to 28, $M_1^{mm}$ may be represented by the following Equation 29 and $M_2^{mm}$ may be represented by the following Equation 30.

$$M_1^{mn}=\int_{-b}^{-a}\sin(\beta_m(x+b))(\alpha_n(x+b))dx=$$ [Equation 29]

$$\begin{cases}\frac{b-a}{2},\text{ if }\beta_m=\alpha_n\\\frac{\beta_m(-1)^{m+1}}{\beta_m^2-\alpha_n^2}\sin(\alpha_n(b-a)),\text{ if }\beta_m\neq\alpha_n\end{cases}$$

$$M_2^{mn}=\int_{-b}^{w-a}\sin(\chi_m(x-w+b))\sin(\alpha_n(x+b))dx=$$ [Equation 30]

$$\begin{cases}(-1)^2\frac{2\alpha_n(w-(a+b))+\sin(2\alpha_n(a+b))}{4\alpha_n},\text{ if }\chi_m=\alpha_n\\\frac{\chi_m(-1)^m}{\chi_m^2-\alpha_n^2}\sin(\alpha_n(a+b)),\text{ if }\chi_m\neq\alpha_n\end{cases}$$

As such, the inside of the 4-port TEM cell in which electronic devices of which the distribution of electromagnetic waves are analyzed in a radio wave system in accordance with the embodiment of the present invention are located are divided into a plurality of regions as described above and the electronic potentials in each region inside the 4-port TEM cell are each calculated by calculating the discrete mode coefficients, respectively, and then, using the calculated discrete mode coefficients and the distribution of electromagnetic waves inside the 4-port TEM cell is analyzed by the calculated electrostatic potentials, as described above. Here, x and y components of electric field of the 4-port TEM cell cross section may each be represented by $$Ex=-\frac{\partial\Phi}{\partial x},$$

$$Ey=-\frac{\partial\Phi}{\partial y}.$$

Hereinafter, an apparatus for analyzing a distribution of electromagnetic waves using a 4-port TEM cell in a radio wave system in accordance with the embodiment of the present invention will be described in more detail with reference to FIG. 7.

Figure 7:
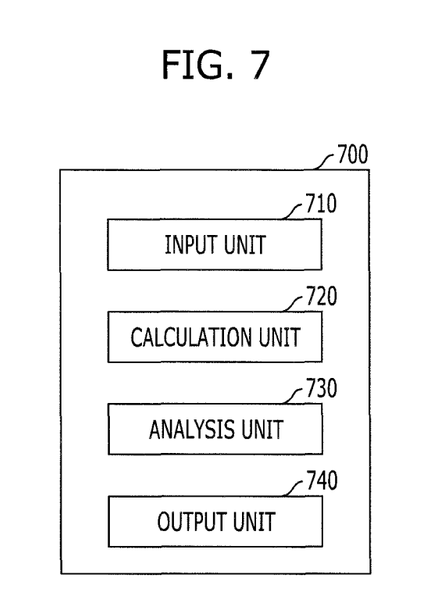
FIG. 7 is a diagram schematically illustrating a structure of an apparatus for analyzing a distribution of electromagnetic waves using the 4-port TEM cell in a radio wave system in accordance with the embodiment of the present invention.

FIG. 7 is a diagram schematically illustrating a structure of the apparatus for analyzing a distribution of electromagnetic waves using a 4-port TEM cell in a radio wave system in accordance with the embodiment of the present invention.

Referring to FIG. 7, an apparatus 700 for analyzing a distribution of electromagnetic waves includes an input unit 710 that applies a reference electrostatic potential to the 4-port TEM cell in which electronic devices of which the electromagnetic waves are analyzed are located, a calculation unit 720 calculating the electrostatic potentials inside the 4-port TEM cell based on the foregoing Equations, an analysis unit 730 analyzing the distribution of electromagnetic waves inside the 4-port TEM cell, that is, the distribution of electromagnetic waves based on the electrostatic potentials inside the 4-port TEM cell, and an output unit 740 outputting the distribution of electromagnetic waves.

Here, the input unit 710 applies the reference electrostatic potential to the inside of the 4-port TEM cell through the 4-port TEM cell and the electromagnetic waves are distributed inside the 4-port TEM cell in correspondence with the applied electrostatic potential. Further, the calculation unit 720 calculates the electrostatic potentials in the regions inside the 4-port TEM cell as described in the above Equations by using the mode matching scheme. Here, the calculation of the electrostatic potentials in the regions inside the 4-port TEM cell is described in detail based on the above Equations and therefore, the detailed description thereof will be omitted.

Further, the analysis unit 730 analyzes the electrostatic potentials in the regions inside the 4-port TEM cell to analyze the distribution of electromagnetic waves inside the 4-port TEM cell and output the analyzed distribution of electromagnetic waves through the output unit 740. Here, the process for analyzing a distribution of electromagnetic waves using a 4-port TEM cell in a radio wave system in accordance with the embodiment of the present invention will be described in more detail with reference to FIG. 8.

Figure 8:
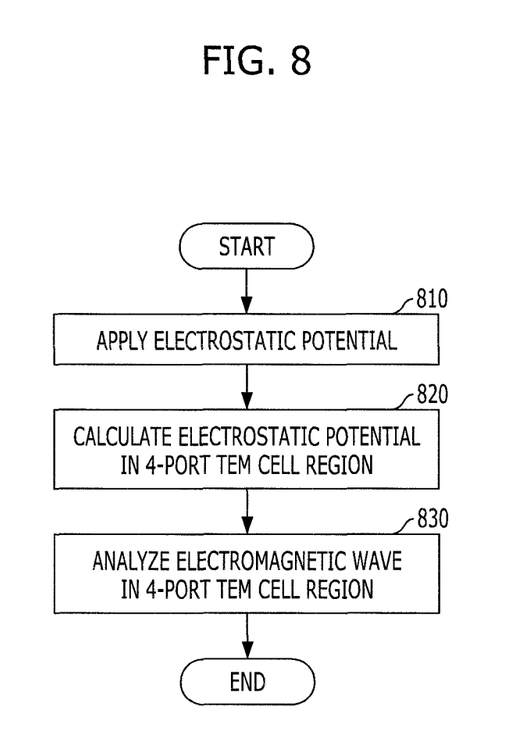
FIG. 8 is a diagram schematically illustrating a process for analyzing a distribution of electromagnetic waves using the 4-port TEM cell in a radio wave system in accordance with the embodiment of the present invention.

FIG. 8 is a diagram schematically illustrating a process for analyzing a distribution of electromagnetic waves using a 4-port TEM cell in a radio wave system in accordance with the embodiment of the present invention.

Referring to FIG. 8, in S810, the apparatus for analyzing electromagnetic waves applies the reference electrostatic potentials to the 4-port TEM cell in which the electronic devices of which the electromagnetic waves are analyzed are located.

Further, in S820, the electrostatic potentials are calculated inside the 4-port TEM cell based on the above Equations by using the mode matching scheme. Here, the calculation of the electrostatic potentials in the regions inside the 4-port TEM cell is described in detail based on the above Equations and therefore, the detailed description thereof will be omitted.

Next, in S830, the distribution of electromagnetic waves inside the 4-port TEM cell is analyzed by analyzing the electrostatic potentials in the regions inside the 4-port TEM cell. Here, the distribution of electromagnetic waves inside a 4-port TEM cell in a radio wave system in accordance with the embodiment of the present invention will be described in more detail with reference to FIGS. 9 to 11.

Figure 9:
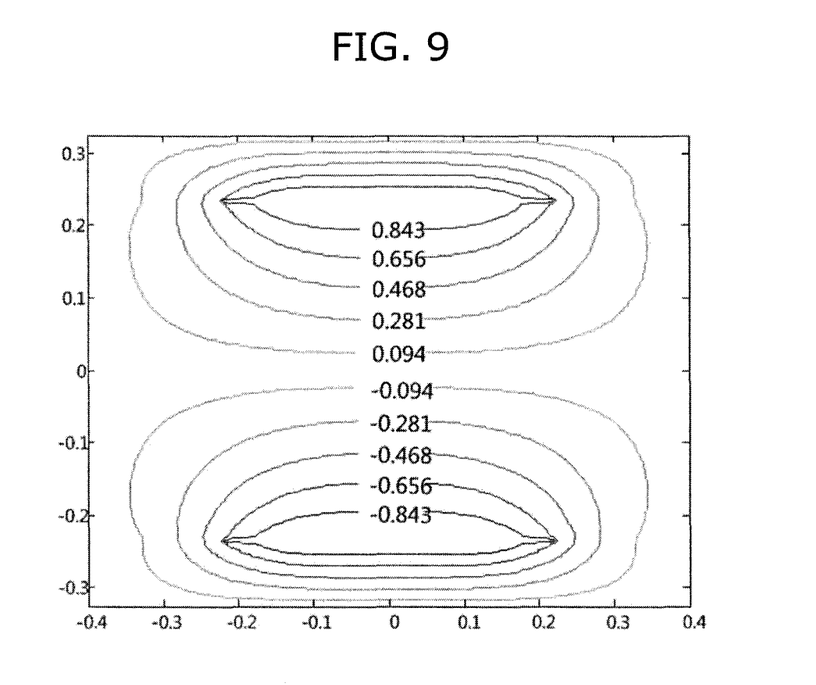
FIGS. 9 to 11 are diagrams schematically illustrating a process for analyzing equipotential and a distribution of electromagnetic waves inside the 4-port TEM cell in a radio wave system in accordance with the embodiment of the present invention.
Figure 10:
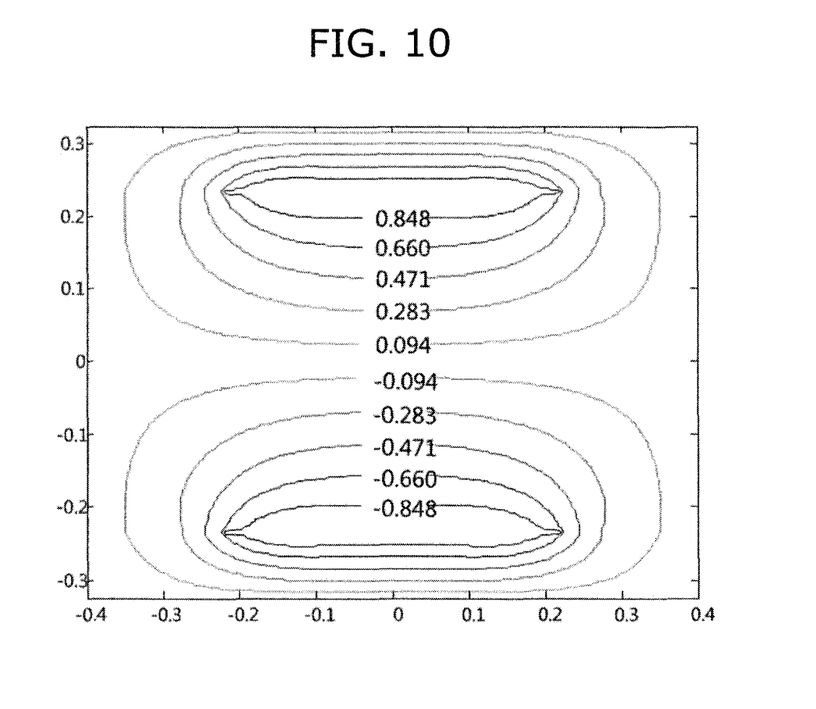
Figure 11:
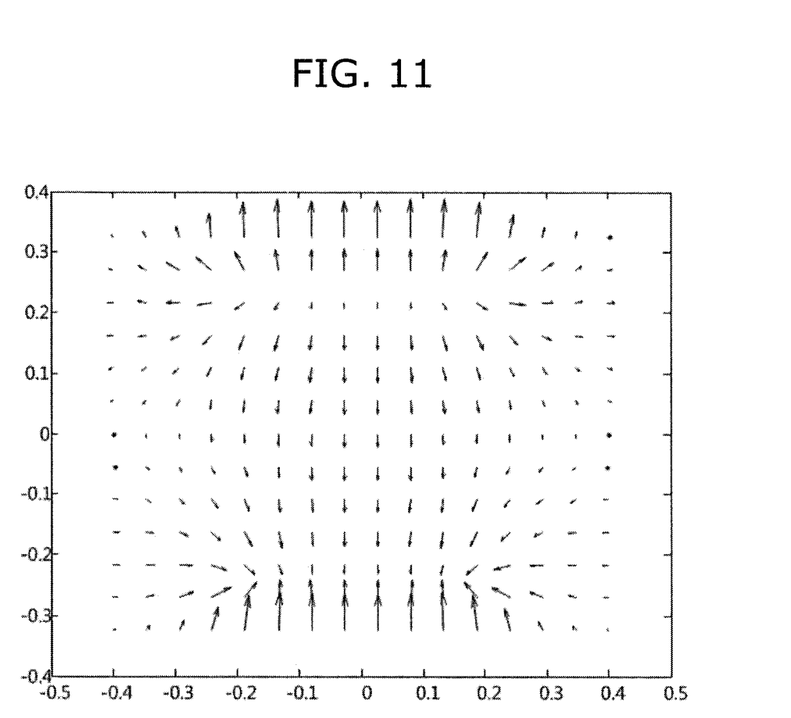

FIGS. 9 to 11 are diagrams schematically illustrating equipotential and a distribution of electromagnetic waves inside a 4-port TEM cell in a radio wave system in accordance with the embodiment of the present invention. Here, FIGS. 9 and 10 are diagrams illustrating equipotential results inside the 4-port TEM cell according to a change in the number of modes when the reference electrostatic potential of V1=+1V and V2=−1V is applied to the inside of the 4-port TEM cell. Further, FIG. 11 is a diagram illustrating a distribution of electric field at the 4-port TEM cell cross section, that is, a size and a direction of electric field when the reference electrostatic potential of V1=+1V and V2=−1V as the electrostatic potential is applied to the inside of the 4-port TEM cell.

When the number of modes in the plurality of regions divided inside the 4-port TEM cell, that is, the first region, the fourth region, and the seventh region is 5 and the number of modes in the second region, the third region, the fifth region, and the sixth region is 1, the potentials inside the 4-port TEM cell may be represented as illustrated in FIG. 9 and when the number of modes in the plurality of regions divided inside the 4-port TEM cell, that is, the first region, the fourth region, and the seventh region is 10 and the number of modes in the second region, the third region, the fifth region, and the sixth region is 2, the potentials inside the 4-port TEM cell may be represented as illustrated in FIG. 10. That is, as illustrated in FIG. 10, the distribution of potentials, that is, the electromagnetic waves inside the 4-port TEM cell is distributed based on the septa included inside the 4-port TEM cell.

In accordance with the embodiments of the present invention, it is possible to minimize the damage of a body of a user and the malfunction of electronic devices due to the electromagnetic waves of the electronic devices in the radio wave system by accurately analyzing the distribution of electromagnetic waves according to the application of electrostatic potential using the mode matching method in the 4-port transverse electromagnetic (TEM) cell.

Meanwhile, the embodiments is described in detail in the detailed description of the present invention, but may be variously modified without departing from the scope of the present invention. Accordingly, the scope of the present invention is not construed as being limited to the described embodiments but is defined by the appended claims as well as equivalents thereto.

What is claimed is:

1. An apparatus for analyzing a distribution of electromagnetic waves in a radio wave system, the apparatus comprising:
    an input unit configured to apply a reference electrostatic potential to an inside of a 4-port transverse electromagnetic (TEM) cell in which electronic devices are located;
    a calculation unit configured to calculate electrostatic potentials inside the 4-port TEM cell using a mode matching scheme,
    wherein the calculation unit divides the inside of the 4-port TEM cell into a plurality of regions according to a septum included in the inside of the 4-port TEM cell to calculate the electrostatic potentials in each region,
    the calculation unit calculates discrete mode coefficients and calculates the electrostatic potentials in each region using the discrete mode coefficients,
    the calculation unit calculates the electrostatic potentials in each region in consideration of a Dirichlet boundary condition and a Neumann boundary condition at a point at which each region contacts each other, and
    wherein the calculation unit calculates the electrostatic potentials in each region in consideration of a continuity of electrostatic potentials and a continuity of y-axis variations at a point at which each region contacts each other;
    an analysis unit configured to analyze the distribution of electromagnetic waves inside the 4-port TEM cell through the electrostatic potentials inside the 4-port TEM cell; and
    an output unit configured to output the distribution of electromagnetic waves inside the 4-port TEM cell.

2. The apparatus of claim 1, wherein the input unit applies the reference electrostatic potential through a multi-port of the 4-port TEM cell.

3. The apparatus of claim 1, wherein the 4-port TEM cell is divided into seven regions.

4. The apparatus of claim 1, wherein the 4-port TEM cell comprises two septa.

5. A non-transitory computer readable recording medium (CRRM) containing programming instructions configured to perform a method for analyzing a distribution of electromagnetic waves in a radio wave system, comprising:
    applying a reference electrostatic potential to an inside of a 4-port transverse electromagnetic (TEM) cell in which electronic devices are located;
    calculating electrostatic potentials inside the 4-port TEM cell using a mode matching scheme,
        wherein in the calculating
            the inside of the 4-port TEM cell is divided into a plurality of regions according to a septum included in the inside of the 4-port TEM cell to calculate the electrostatic potentials in each region,
            discrete mode coefficients are calculated and the electrostatic potentials in each region are calculated using the discrete mode coefficients,
            the electrostatic potentials in each region are calculated in consideration of a Dirichlet boundary condition and a Neumann boundary condition at a point at which each region contacts each other,
            the electrostatic potentials in each region are calculated in consideration of a continuity of electrostatic potentials and a continuity of y-axis variations at a point at which each region contacts each other; and analyzing the distribution of electromagnetic waves inside the 4-port TEM cell based on the electrostatic potentials inside the 4-port TEM cell.

6. The CRRM of claim 5, wherein in the inputting, the reference electrostatic potential is applied through a multi-port of the 4-port TEM cell.

7. The CRRM of claim 5, wherein the 4-port TEM cell is divided into seven regions.

8. The CRRM of claim 5, wherein the 4-port TEM cell comprises two septa.

9. An apparatus for analyzing a distribution of electromagnetic waves in a radio wave system, the apparatus comprising:
   a 4-port transverse electromagnetic (TEM) cell comprising a plurality of regions according to a septum included inside of the 4-port TEM cell;
   an input unit configured to apply a reference electrostatic potential inside of the 4-port transverse electromagnetic (TEM) cell;
   a calculation unit configured to calculate electrostatic potentials inside the 4-port TEM cell using a mode matching scheme,
   wherein the calculation unit divides the inside of the 4-port TEM cell into a plurality of regions according to the septum included in the 4-port TEM cell to calculate the electrostatic potentials in each region,
   the calculation unit calculates discrete mode coefficients and calculates the electrostatic potentials in each region using the discrete mode coefficients,
   the calculation unit calculates the electrostatic potentials in each region in consideration of a Dirichlet boundary condition and a Neumann boundary condition at a point at which each region contacts each other, and
   wherein the calculation unit calculates the electrostatic potentials in each region in consideration of a continuity of electrostatic potentials and a continuity of y-axis variations at a point at which each region contacts each other;
   an analysis unit configured to analyze the distribution of electromagnetic waves inside the 4-port TEM cell through the electrostatic potentials inside the 4-port TEM cell; and
   an output unit configured to output the distribution of electromagnetic waves inside the 4-port TEM cell.

10. The apparatus of claim 9, wherein the input unit applies the reference electrostatic potential through a multi-port of the 4-port TEM cell.

11. The apparatus of claim 9, wherein the 4-port TEM cell is divided into seven regions.

12. The apparatus of claim 9, wherein the 4-port TEM cell comprises two septa.

* * * * *